United States Patent [19]

Awakowicz et al.

[11] Patent Number: 4,810,066
[45] Date of Patent: Mar. 7, 1989

[54] COVER FOR TELECOMMUNICATIONS EQUIPMENT

[75] Inventors: Erwin Awakowicz; Erwin Grassl, both of Munich, Fed. Rep. of Germany

[73] Assignee: Siemens Aktiengesellschaft, Berlin and Munich, Fed. Rep. of Germany

[21] Appl. No.: 29,787

[22] Filed: Mar. 25, 1987

[30] Foreign Application Priority Data

Apr. 11, 1986 [DE] Fed. Rep. of Germany ... 8609929[U]

[51] Int. Cl.⁴ ............................. E06B 3/32; G02F 1/13
[52] U.S. Cl. ..................................... 350/356; 350/334;
  49/463; 49/465; 379/428; 379/440
[58] Field of Search .......................... 350/334, 355–356;
  379/419–420, 426, 437, 440, 428, 429, 434, 435,
  436; D14/53, 59, 60, 62; 49/463, 465, 466

[56] References Cited

U.S. PATENT DOCUMENTS

| 11,227 | 7/1854 | Ingalls | 49/463 |
| 1,044,383 | 11/1912 | Hatch | 49/463 X |
| 1,165,805 | 12/1915 | Quigley | 49/465 |
| 3,913,971 | 10/1975 | Green | 49/465 X |
| 4,284,855 | 8/1981 | Adams et al. | 379/440 |
| 4,395,591 | 7/1983 | Kaczkos | 379/435 |

OTHER PUBLICATIONS

Greska, Hanns et al., "Siemens Miniset 200-A Compact Telephone for all Locations", *Telecom Report*, Dec. 1985.

Primary Examiner—Eugene R. LaRoche
Assistant Examiner—Nathan W. McCutcheon

[57] ABSTRACT

A cover is provided for interchangeable character media or light sources including latch elements which interact with corresponding cooperating latches within a depression of the terminal equipment. The cover which can be released or attached at any time without the assistance of tools. The cover is fashioned strip-like and one end thereof includes a short nose cooperating with a recess in the depression whereas the other end of the cover has a resilient tab including a crowned thickening in its end region, this resilient tab engaging behind a shoulder within the depression. The cover lies against projections within the depression with pre-tension.

4 Claims, 2 Drawing Sheets

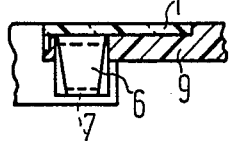
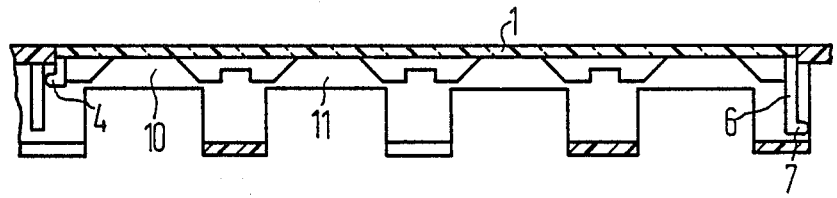
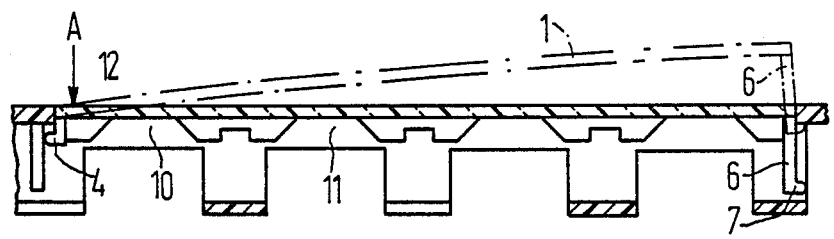

COVER FOR TELECOMMUNICATIONS EQUIPMENT

BACKGROUND OF THE INVENTION

1. Field of the Invention

The present invention comprises a cover for interchangeable character media or light sources in telecommunications terminal equipment comprising latch elements which collaborate with corresponding cooperating latches within a depression.

2. Description of the Prior Art

Covers for interchangeable character media in the form of paper strips containing numerals or written characters are known in numerous embodiments. Among other things, thus, indentification plates in telephone stations are known which comprise pocket-like-receptacles for example, paper strips containing the telephone numbers.

Further, it is also known in keys of telephone terminal equipment to snap a transparent key head serving as cover onto the key member. An interchangeable character medium is usually arranged under this key head.

Both coverings are affected by the disadvantage that they are difficult to remove from the depression or, respectively, from the key member, so that a tool in the form of a screwdriver must be used as an aid in most instances.

SUMMARY OF THE INVENTION

It is therefore an object of the present invention to fashion a cover for telecommunications terminal equipment such that the application and removal is possible at any time without making use of auxiliary means.

In accord with the invention, this object is achieved in that the cover is fashioned strip-like and one end thereof includes a short nose interacting with a recess within the depression whereas the other end of the cover has a resilient tab includes a crowned thickening in its end region, this tab engaging behind a shoulder within the depression, and in that the cover is seated with pre-tension against projections within the depression.

Such a design of the latch elements at the cover which are fashioned, first, as a short nose engaging into a recess in the depression and, second, as a resilient, relatively long tab, allows the cover, first, to be easily introduced into the depression and, second, to be in turn quickly removed by pressing a finger onto the region comprising the short nose. As a result of this pressure, the crowned thickening in the end region of the relatively long tab lifts off from the shoulder in the depression, so that the cover can be easily removed from the terminal equipment for the purpose of replacing or substituting a character medium. This procedure is further facilitated in that the cover is slightly pre-stressed and lies against projections within the depression in this condition.

In case character media are to be protected by the cover, a clear, i.e. transparent structure of the cover is selected. When, however, a light source, for example, a light-emitting diode, is to be covered, then the surface of the cover is riffled in order to act as a diffuser for the light.

BRIEF DESCRIPTION OF THE DRAWINGS

The invention shall be set forth below with reference to an exemplary embodiment.

FIG. 2 is a side sectional view taken generally along the line II—II of FIG. 1.

FIG. 3 is a side sectional view taken generally along the line III—III of FIG. 1 showing the cover secured in the telephone station.

FIG. 4 is a side sectional view taken generally along the line IV—IV of FIG. 1 showing the detachment of the cover from the telephone station.

DESCRIPTION OF THE PREFERRED EMBODIMENTS

Figure 1:
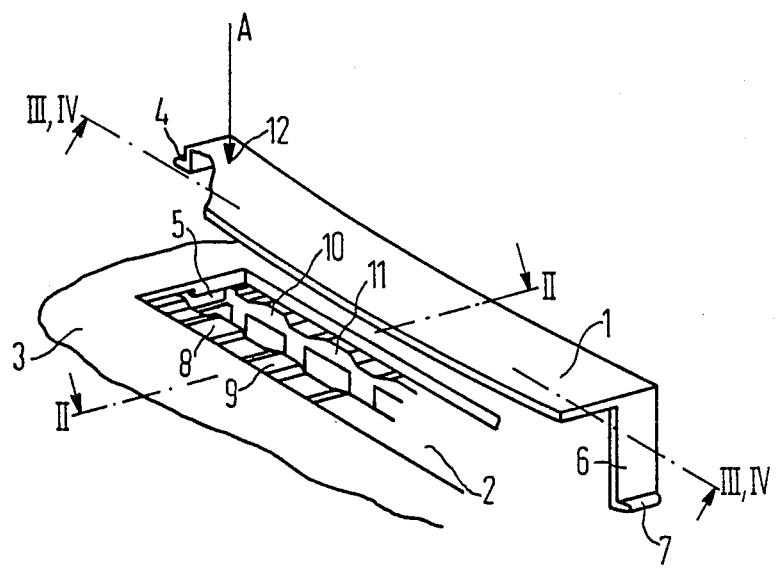
FIG. 1 is a perspective view of a cover employed in telephone stations.

The illustrated cover 1 serves the purpose of protecting interchangeable character media accommodated within a depression 2 in the upper housing part 3 of a telephone station as well as protecting display elements in the form of light-emitting diodes.

The cover 1 is fashioned strip-shaped and includes a short catch nose 4 at its one free end, this short catch nose 4 engaging into a recess 5 corresponding thereto in terms of its contours and provided in the edge region of the depression 2. At its other free end, the cover includes a resilient tab 6 proceeding perpendicular to the plane of the cover, this tab 6 having a crowned thickening 7 outwardly directed at its free end. This thickening 7 engages behind a shoulder within the depression 2 as seen in FIGS. 3 and 4. The depression 2 includes a plurality of webs 8 and 9 which serve as seat for the interchangeable character media, for example, a paper strip containing a numerical or written character. The cover 1 itself has its edge regions of its long sides supported against projections 10 and 11 within the depression 2.

In the mounted condition of the cover 1 within the depression, the cover 1 terminates flush with the upper housing part 3. When putting the cover in place, the nose 4 is first introduced into the recess 5 and, subsequently, the end comprising the resilient tab 6 is pressed into the depression. A good seating of the cover against the projections 10 and 11 is further achieved in that the cover is slightly bent or bowed in the direction toward the depression, or respectively, in the direction of its nose and its resilient tab, i.e. is prestressed. As a result of pressure on the point 12 indicated in the direction of arrow A, as best seen in FIG. 4, the resilient tab 6 is releasable from its shoulder, so that the cover 1 can be easily removed from the telephone station.

The cover 1 can thereby be clear, i.e. transparent in the region of the character medium whereas it can include a riffled surface in the region of the light-emitting diode, this region thus serving as a diffuser for the light.

As is apparent from the foregoing specification, the invention is susceptible of being embodied with various alterations and modifications which may differ particularly from those that have been described in the preceding specification and description. It should be understood that we wish to embody within the scope of the patent warranted hereon all such modifications as reasonably and properly come within the scope of our contribution to the art.

We claim as our invention:

1. A covering system for interchangeable character media or light sources in telecommunications terminal equipment including latch elements which interact with corresponding cooperating latches within a depression of the terminal equipment comprising:

a cover which is fashioned strip-like and which has a short nose at one end and a relatively longer resilient tab at an opposite end, said tab including a crowned thickening at its free end, said depression being sized to receive said cover and having a recess at one end to cooperate with said nose, a shoulder at an opposite end for said tab to engage behind and projections spaced below a top of the depression for supporting the cover such that a top surface of said cover is flush with a surface of the telecommunications equipment, said projections being spaced from an end of the depression adjacent to said short nose such that manual pressure applied in the area of the short nose, perpendicular to the surface of said cover will cause the resilient tab to be released from its shoulder so that the cover can be easily removed from the telecommunication equipment without making use of any auxilliary means.

2. A covering system according to claim 1, wherein said cover is slightly bowed in a direction toward said depression such that the cover is seated with pretension within the depression.

3. A covering system according to claim 1, wherein the cover has a smooth, transparent surface.

4. A covering system according to claim 1, wherein the cover has a riffled surface.

* * * * *